United States Patent [19]

Murao et al.

[11] Patent Number: 4,521,763
[45] Date of Patent: Jun. 4, 1985

[54] A-D CONVERTER AND METHOD OF A-D CONVERSION

[75] Inventors: Yutaka Murao, Yokohama, Japan; Taira Nishizono, West Bloom Field, Mich.

[73] Assignee: Tokyo Shibaura Denki Kabushiki Kaisha, Kawasaki, Japan

[21] Appl. No.: 419,571

[22] Filed: Sep. 17, 1982

Related U.S. Application Data

[63] Continuation-in-part of Ser. No. 119,023, Feb. 6, 1980, abandoned, which is a continuation of Ser. No. 918,605, Jun. 23, 1978, abandoned.

[30] Foreign Application Priority Data

Jun. 24, 1977 [JP] Japan .................. 52-75004

[51] Int. Cl.³ ............................................ H03K 13/02
[52] U.S. Cl. ........................ 340/347 AD; 340/347 NT
[58] Field of Search .............. 340/347 AD, 347 NT, 340/347 CC; 324/99 D

[56] References Cited

U.S. PATENT DOCUMENTS

| | | | |
|---|---|---|---|
| 3,500,196 | 3/1970 | Cooper | 340/347 CC |
| 3,633,202 | 1/1972 | Kuckein | 340/347 AD |
| 3,725,903 | 3/1973 | Kosakowski | 340/347 CC |
| 3,987,435 | 10/1976 | Ikeda | 340/347 NT |
| 4,034,364 | 7/1977 | Fukuda | 340/347 NT |
| 4,063,236 | 12/1977 | Amemiya | 340/347 NT |

*Primary Examiner*—Charles D. Miller
*Attorney, Agent, or Firm*—Finnegan, Henderson, Farabow, Garrett & Dunner

[57] ABSTRACT

An A-D converter for converting into a pulse train signal an analog input voltage signal from a signal source, said A-D converter comprising a signal generator for providing a low analog input voltage signal of a low fixed level $V_L$, a signal generator for providing a high analog input voltage signal of a high fixed level $V_H$, a multiplexer connected to the signal source and the signal generators for receiving the signals therefrom and supplying the signals selectively and successively, a V-T converter connected to the multiplexer for converting a selected one of the analog input voltage signals into a pulse train signal; a memory for storing instruction programs used for A-D conversion, a central processing unit, a first counter connected to the V-T converter for counting pulses of the pulse train signal, said first counter being loaded with a specific value supplied from the central processing unit, a clock pulse generator for producing clock pulse, a second counter connected to the clock pulse generator for counting the clock pulses while the first counter is counting the same and a control circuit.

9 Claims, 20 Drawing Figures

FIG. 6A CHANNEL DATA

FIG. 6B OUTPUT OF CONVERTER

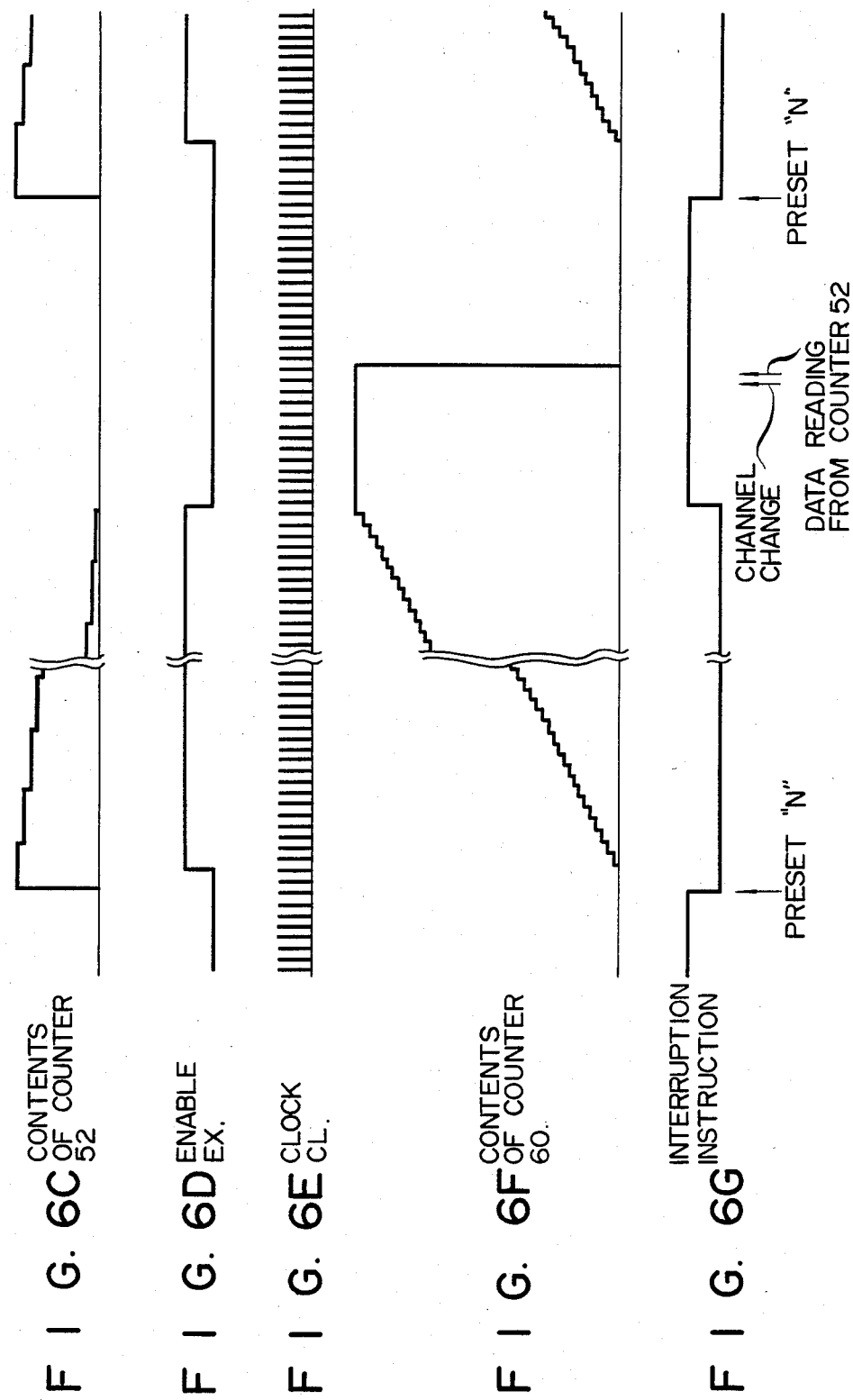

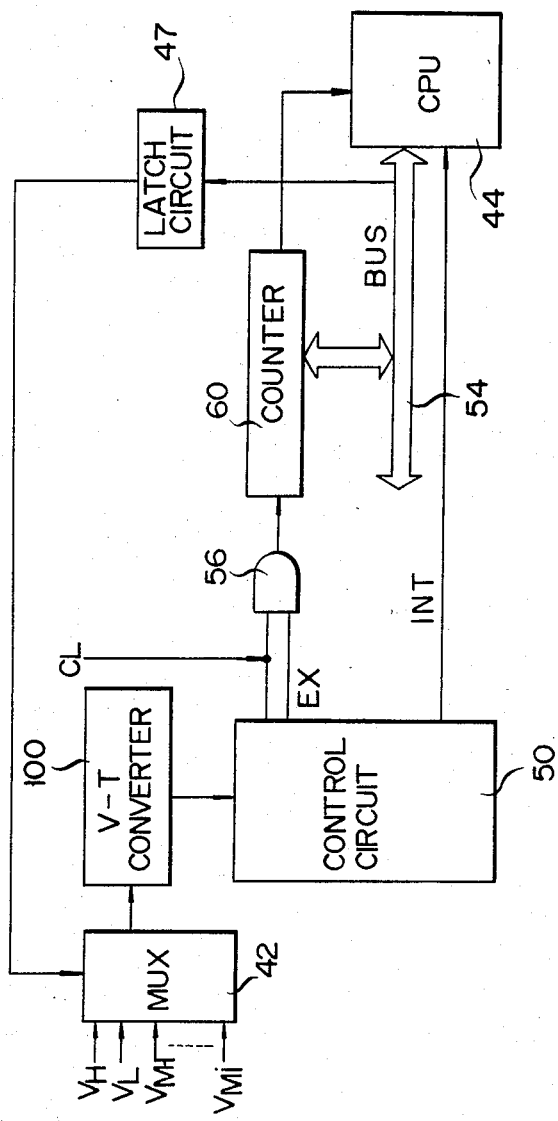
F I G. 9

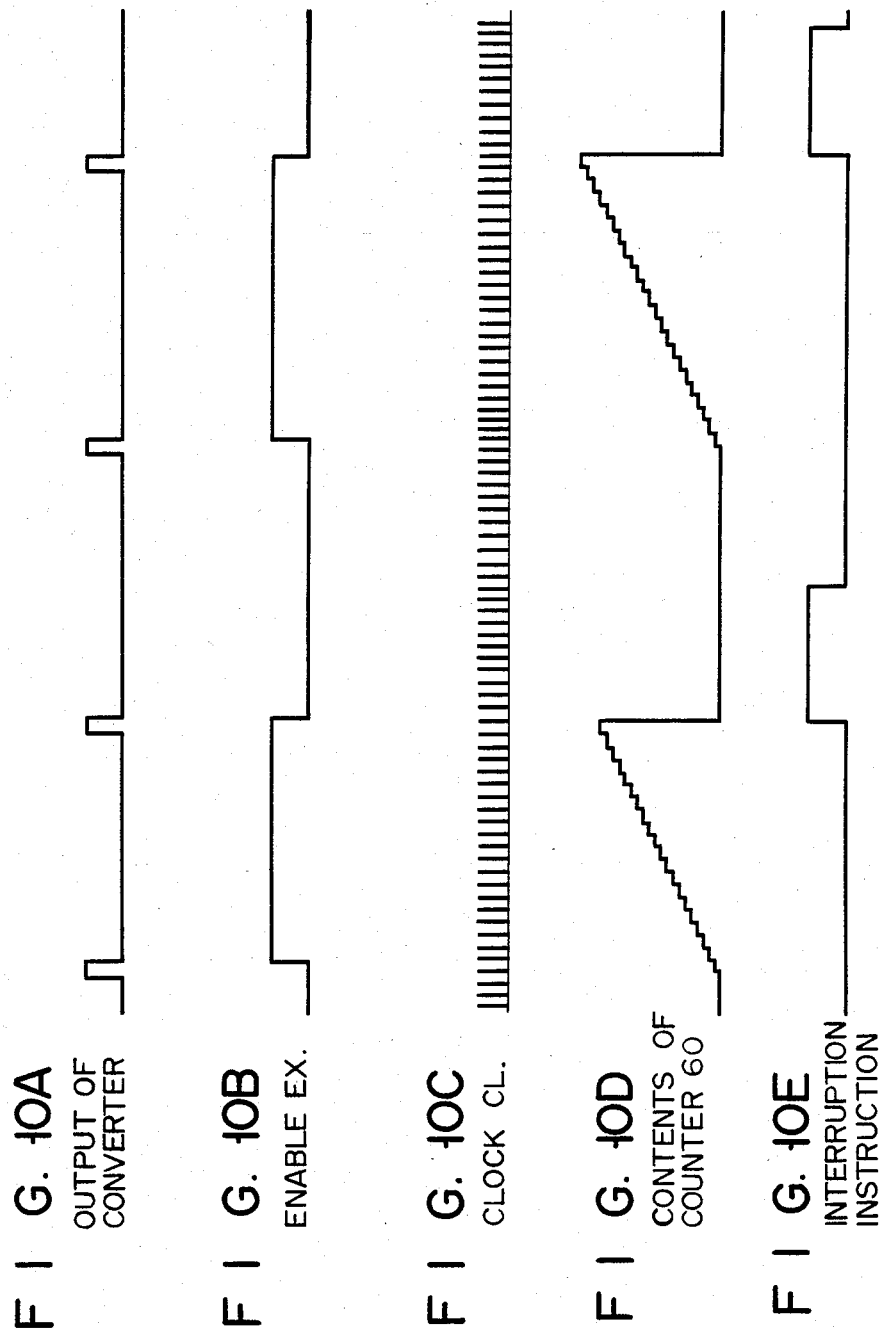

A-D CONVERTER AND METHOD OF A-D CONVERSION

CROSS-REFERENCE TO RELATED APPLICATION

This application is a continuation-in-part of our application Ser. No. 119,023 filed Feb. 6, 1980 now abandoned, which in turn is a continuation of our application Ser. No. 918,605 filed June 23, 1978 and now abandoned.

BACKGROUND OF THE INVENTION

This invention relates to an apparatus and method for converting an analog input voltage signal into a digital signal.

Generally, an analog-digital converter (hereinafter referred to as "an A-D converter") is not used alone, but as an attachment to a data-processing unit of a computer. The reason is that the data-processing unit carries out arithmetic operation, using signals digitalized by an A-D converter. The A-D converter acting as an attachment to the data-processing unit performs A-D conversion upon receipt of an instruction for said conversion from the data-processing unit. Hitherto, all hardware for A-D conversion has been included in the A-D converter itself, tending to increase its cost. In recent years, it is demanded to reduce the cost of all types of machinery. Thus it has become necessary for the A-D converter, too, to meet such request.

In view of the above-mentioned circumstances, this invention is intended to provide an A-D converter including a method for A-D conversion which comprises a voltage-time period converter (hereinafter referred to as "a V-T converter") in which the voltage level of an analog input voltage signal and the time period of an oscillated output signal have a linear relationship, and wherein an interruption request is made in proper timing to a data-processing unit of a computer system, causing said unit to take over part of the function of A-D conversion hardware in order to decrease the cost of the A-D converter.

SUMMARY OF THE INVENTION

It is accordingly an object of this invention to provide a method of A-D conversion using a V-T converter.

Another object of the invention is to provide a method of A-D conversion in which part of the function of A-D conversion hardware is taken over by the data-processing unit of a computer system.

Still another object of the invention is to provide a method of A-D conversion using a V-T converter and the data-processing unit of a computer system.

Still another object of the invention is to provide an A-D converter the cost of which is low.

Another object of the invention is to provide an A-D converter which includes a V-T converter.

A further object of the invention is to provide an A-D converter which includes the data-processing unit of a computer system.

A still further object of the invention is to provide an A-D converter which includes a V-T converter and the data-processing unit of a computer system.

To attain the objects mentioned above, this invention provides an A-D converter for converting into a pulse train an analog input voltage signal from a signal source which is to be measured. The A-D converter comprises the following elements:

(1) first signal means for providing a first analog input voltage signal of a first fixed level $V_L$;

(2) second signal means for providing a second analog input voltage signal of a second fixed level $V_H$ which is higher than said first fixed level $V_L$;

(3) multiplexer means connected to said signal source, said first signal means and said second signal means for receiving the signals therefrom and supplying the signals selectively and successively;

(4) a V-T converter connected to said multiplexer means for converting a selected one of the analog input voltage signal to be measured and the first and second analog input voltage signals into a pulse train signal having a period linearly proportional to the voltage level of the selected analog input voltage signal;

(5) a memory for storing instruction programs used for A-D conversion;

(6) a central processing unit;

(7) a first counter connected to said V-T converter to count the number of pulses of said pulse train signal issued from said V-T converter, said first counter also being connected to an external bus and loaded with a specific value through the external bus from the central processing unit;

(8) a clock pulse generator producing clock pulses of fixed period;

(9) a second counter connected to said clock pulse generator to continue counting the number of said clock pulses issued from said clock pulse generator during the time interval when said first counter continues counting, said second counter being also connected to the external bus, through which the contents of said second counter is to be read by the central processing unit; and

(10) control means operable to issue an enabling signal for controlling the start and stop of counting of said first and second counters such that when counting is stopped, the contents of said second counter represents a time interval during which said first counter counts out said specific number of pulses issued from said V-T converter, said control means operable to supply an interrupt signal to the central processing unit when said first counter counts out the number of pulses equal to said specific value loaded through the external bus from the central processing unit.

The central processing unit comprising an internal bus, register means including a program counter and connected to said internal bus, at least one accumulator connected to said internal bus for storing data, an arithmetic logic unit connected to said internal bus and said at least one accumulator and for performing an arithmetic calculation on the basis of the data stored in said register means and said at least one accumulator, an interrupt control connected to said control means for receiving an interrupt signal therefrom to control the start of an interrupt program, a buffer for connecting said external bus to said internal bus, and a bus control connected to said buffer for generating control signals required to perform data transfer, by way of said external and internal buses, between said multiplexer means and first and second counters, and between those circuits in said central processing unit which are connected to said internal bus, said arithmetic calculation being indicated by the following equation:

$$M = (n_M - n_L)/(n_H - n_L) \times 2^n$$

where,

M is the digital value of the unknown voltage level $V_M$ of the analog input voltage signal to be measured, $2^n$ is a full scale of the converted digital value, $n_L$ is the contents of said second counter which represents the time interval during which said first counter counts out said first specific number of pulses under the condition that said first analog input signal of said first voltage level $V_L$ is selected as the input signal to said V-T converter, $n_H$ is the contents of said second counter which represents the time interval during which said first counter counts out said specific number of pulses under the condition that said second analog input signal of said second voltage level $V_H$ is selected as the input signal to said V-T converter, and $n_M$ is the contents of said second counter which represents the time interval during which said first counter counts out said specific number of pulses under the condition that said analog input signal of said unknown voltage level $V_M$ is selected as the input signal to said V-T converter.

This invention further provides an A-D conversion method using a V-T converter wherein the voltage level of an input signal and the time period of an oscillated output signal have a linear relationship, and comprising the steps of:

(A) loading a first counter with a specific value, (B) supplying a first analog input voltage signal of a first voltage level $V_L$ to said V-T converter, (C) counting, by said first counter, first pulses issued from said V-T converter which correspond to the voltage level $V_L$ of the first analog input voltage signal until the number of pulses counted by said first counter has come to said specific value, (D) counting, by a second counter, clock pulses issued from a clock pulse generator while said first counter counts first pulses from said V-T converter, (E) loading the number $n_L$ of clock pulses counted by said second counter into a central processing unit, (F) loading said first counter with said specific value;

(G) supplying a second analog input voltage signal of a second voltage signal $V_H$ to said V-T converter, (H) counting, by said first counter, second pulses issued from said V-T converter which correspond to the voltage level $V_H$ of the second analog input voltage signal until the number of pulses counted by said first counter has come to said specific value, (I) counting, by said second counter, clock pulses issued from the clock pulse generator while said first counter counts second pulses from said V-T converter, (J) loading the number $n_H$ of clock pulses counted by said second counter into said central processing unit, (K) loading said first counter with said specific value, (L) supplying an analog input voltage signal of an unknown voltage level $V_{M\ l\ to\ be\ measured}$ to said V-T converter, (M) counting, by said first counter, third pulses issued from said V-T converter which correspond to the unknown voltage level $V_M$ of the analog signal to be measured until the number of pulses counted by said first counter has come to said specific value, (N) counting, by said second counter, clock pulses issued from the clock pulse generator while said first counter counts third pulses from said V-T converter, (O) loading the number $n_M$ of clock pulses counted by said second counter into said central processing unit, and (P) carrying out the equation $$M=(n_M-n_L)/(n_H-n_L)\times 2^n$$

by the central processing unit to calculate the digital value M converted from the unknown voltage level $V_M$ on the basis of the pulse information stored in the central processing unit where, $2^n$ is a full scale of the converted digital value.

BRIEF DESCRIPTION OF THE DRAWINGS

FIGS. 6A to 6G collectively constitute a timing chart illustrating the operation of the A-D converter of FIG. 4;

FIG. 9 is a block circuit diagram of an A-D converter according to another embodiment of this invention; and FIGS. 10A to 10E jointly denote a timing chart of the A-D converter of FIG. 9.

DETAILED DESCRIPTION OF THE PREFERRED EMBODIMENT

Figure 1:
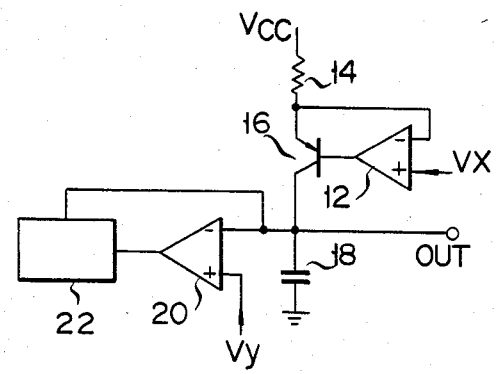
FIG. 1 is a block circuit diagram of a V-T converter included in an A-D converter embodying this invention.

There will be first described by reference to FIG. 1 a V-T converter in which the voltage level of an analog input voltage signal and the time period of an output oscillated signal have a linear relationship.

Referential numeral 12 denotes an operation amplifier, whose noninverting terminal ("+" terminal) is supplied with an analog input voltage signal $V_x$. The inverting terminal ("−" terminal) of the amplifier 12 is connected to a power source (not shown) having a voltage $V_{CC}$ through a resistor 14 having a resistance R. The potentials of both inverting and noninverting terminals vary to the same extent. The emitter of the transistor 16 is connected to the above-mentioned power source through the resistor 14, and the collector of said transistor 16 is grounded through a capacitor 18 having a capacity C. The base of the transistor 16 is connected to the output terminal of the amplifier 12. Where the transistor 16 is operated by an output signal from the amplifier 12, then current running through the collector-emitter path of the transistor 16 is charged in the capacitor 18. The inverting terminal of a comparator 20 is connected to a junction between the collector of the transistor 16 and the capacitor 18. The noninverting terminal of the comparator 20 is supplied with an analog input voltage signal $V_y$. The output terminal of the comparator 20 is connected to a discharge control circuit 22. When supplied with an output signal from the comparator 20, the discharge control circuit 22 causes electric charge stored in the capacitor 18 to be discharged. The aforesaid power source having a voltage $V_{CC}$, resistor 14 and operational amplifier 12 jointly constitute a constant current source. The constant current source is in an optimum condition when the following equation results where the comparator 20 produces an output signal having a logic level of "1"

$$V_y = (V_{CC} - V_x)/RC \cdot T$$

where T denotes the time period of an output oscillated signal.

The V-T converter of FIG. 1 is operated in the following two ways. A first process is to fix an analog input voltage signal $V_x$ and vary another analog input voltage signal $V_y$ so as to render the signal $V_y$ proportional to T. A second process is to fix the analog input voltage signal $V_y$ and vary the analog input voltage signal $V_x$ to obtain a result expressed by the following formula:

$$(V_{CC} - V_x) \propto T^{-1} \equiv f \tag{1}$$

where f represents the frequency of an output signal.

Figure 2:
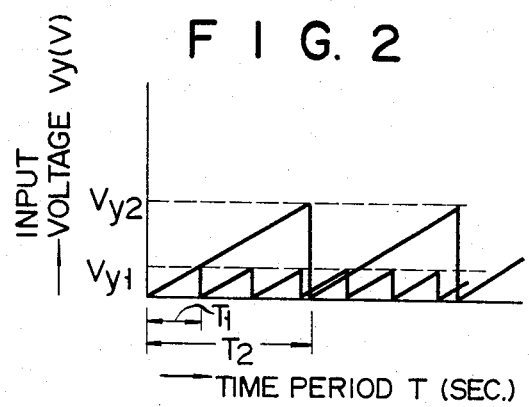
FIG. 2 indicates the waveforms of output signals corresponding to various voltage levels of signals which are supplied to the V-T converter of FIG. 1.

FIG. 2 shows the waveform of an output signal obtained by the first process, namely, when the analog voltage signal $V_y$ is rendered variable. The output signal is drawn off from an output terminal OUT. Where the voltage signal $V_y$ consists of a signal $V_{y1}$, then the output signal has a time period $T_1$. Where the voltage signal $V_y$ is formed of a signal $V_{y2}$, then the output signal has a time period $T_2$. Namely, the output signal has a time period T corresponding to the voltage level of the analog input voltage signal $V_y$. The circuit of FIG. 1 is operated as a V-T converter.

Figure 3:
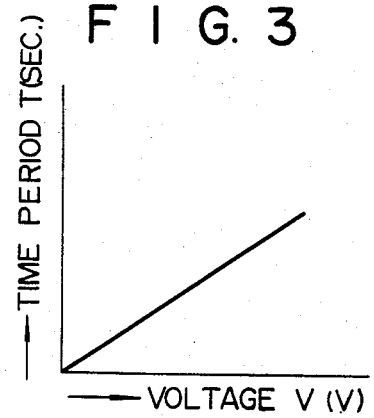
FIG. 3 is a curve diagram of the relationship between the voltage level of an analog input signal supplied to the V-T converter of FIG. 1 and the time period of an output oscillated signal.

FIG. 3 is a curve diagram showing the relationship between the voltage level of an input voltage signal to the V-T converter and the time period of an output oscillated signal, indicating that said relationship has a linear pattern. Where the V-T converter of FIG. 1 displaying the above-mentioned linear relationship is used and an interruption request is made in proper timing to a data-processing unit of a computer system, then it is possible to let said data-processing unit take over part of the function of the hardware of the A-D converter, thereby reducing the cost of the A-D converter.

Figure 4:
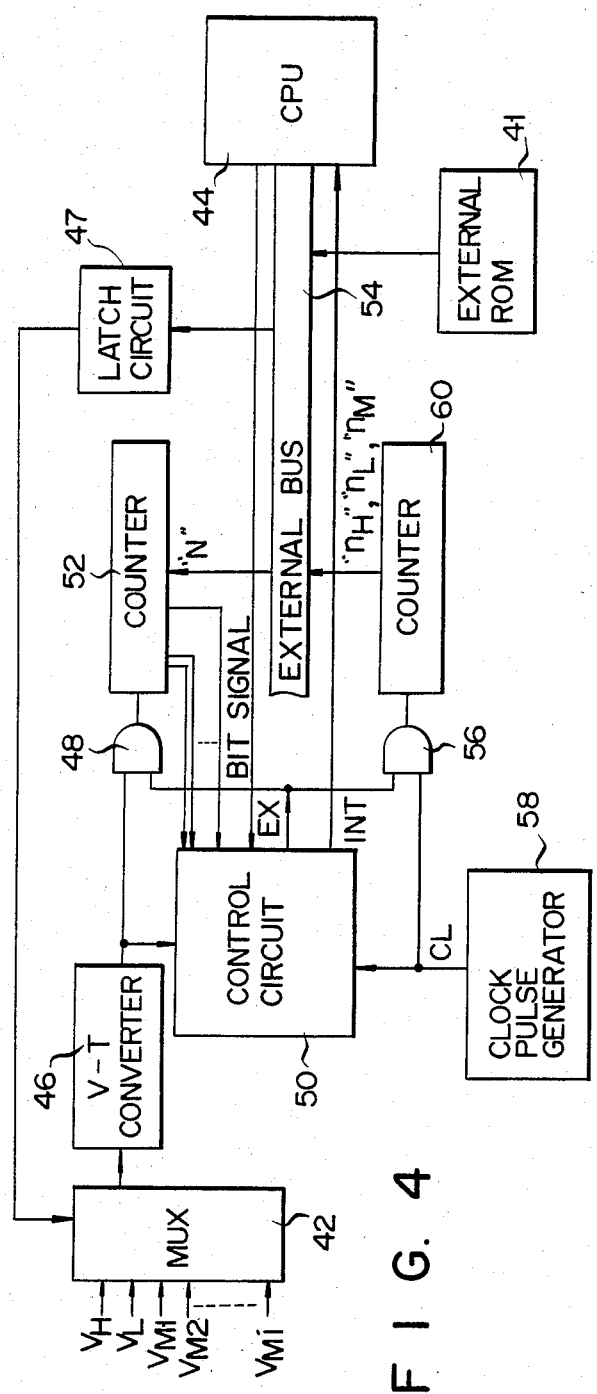
FIG. 4 is a block circuit diagram of an A-D converter embodying this invention.

FIG. 4 is a block circuit diagram of an A-D converter including the V-T converter of FIG. 1 and the data-processing unit of the computer system. There will now be described the respective blocks of FIG. 4. An external ROM (Read Only Memory) 41 stores instruction programs therein used for A-D conversion. A multiplexer (MUX) 42 selects any of the channels of analog input voltage signals. The multiplexer (MUX) 42 is supplied with a signal having a high prescribed voltage level $V_H$, a signal having a low referential voltage level $V_L$ and a plurality of input voltage signals having voltage level $V_{M1}$ to $V_{Mi}$ (i denotes a given natural number) which are to be measured. The multiplexer (MUX) 42 detects the contents of a channel-selecting signal delivered from the data-processing unit of the computer system and selects the corresponding channel of an input voltage signal. The multiplexer (MUX) 42 sends forth the selected voltage signal to a V-T converter 46 disposed on the output side of the multiplexer 42. The V-T converter 46 converts an analog input voltage signal into a pulse train signal having a period linearly proportional to the voltage level of the analog input voltage signal. The input terminal of the V-T converter 46 constitutes the noninverting terminal of the comparator 20 with respect to the V-T converter of FIG. 1. The output terminal of the V-T converter 46 represents a junction between the transistor 16 and capacitor 18. A latch circuit 47 holds an output signal from a data-processing unit or central processing unit (CPU) 44 which selects any of the voltage signal channels of the multiplexer (MUX) 42. A first input terminal of a first AND gate 48 is supplied with an output pulse from the V-T converter 46. While a second input terminal of the first AND gate 48 is supplied with an enable signal EX from a control circuit 50, an output pulse from the V-T converter 46 is conducted to a first counter 52. A number N of pulses from the V-T converter 46 being counted by the first counter 52 is preset therein from the data-processing unit 44 through an external data bus 54. The preset number N is decreased by one bit, each time a pulse is supplied through the first AND gate 48 from the V-T converter 46. A first input terminal of a second AND gate 56 is supplied with a clock pulse CL from a clock pulse generator 58. While an enable signal EX is supplied from the control circuit 50 to a second input terminal of the second AND gate 56, the clock pulse CL is carried to a second counter 60 through said second AND gate 56. The clock pulse CL is desired to have a stable frequency. To this end, the clock pulse generator 58 should preferably consist of a timing clock pulse source (not shown) included in the data-processing unit 44. The second counter 60 counts clock pulses CL delivered through the second AND gate 56.

After a preset number N being counted is preset in the first counter 52, the fall of the initial output pulse issued from the V-T converter 46 is detected. An enable signal EX is sent forth in synchronization with said initial clock pulse CL. Further, the A-D converter of FIG. 4 may be so arranged as to cause an enable signal EX to be produced in synchronization with the detection of the rise of the initial output pulse from the V-T converter 46. When the count made by the first counter 52 is reduced to zero by subtraction the supply of an enable signal EX from the control circuit 50 is stopped. At this time, this control circuit 50 sends forth an interruption instruction INT to the data-processing unit 44. Upon receipt of the interruption instruction INT, a count made by the second counter 60 up to this point is stored in the internal registers of the data-processing unit 44. The registers are normally supplied with a count $n_H$ made by the second counter 60 upon receipt of a signal having a high prescribed voltage level $V_H$, a count $n_L$ made by said second counter 60 upon receipt of a signal having a low referential voltage level $V_L$, and counts $n_{M1}$ to $n_{Mi}$ made by said second counter 60 upon receipt of analog input voltage signals having voltage levels $V_{M1}$ to $V_{Mi}$. The data-processing unit 44 carries out logic operation according to the counts $n_H$, $n_L$, $n_{M1}$ to $n_{Mi}$, and produces data derived from A-D conversion of analog input voltage signals having voltage levels $V_{M1}$ to $V_{Mi}$ which are to be measured. On other occasions than A-D conversion, the data-processing unit 44 acts as the central processing unit (CPU) of the computer system which undertakes operation relative to other jobs.

Figure 5:
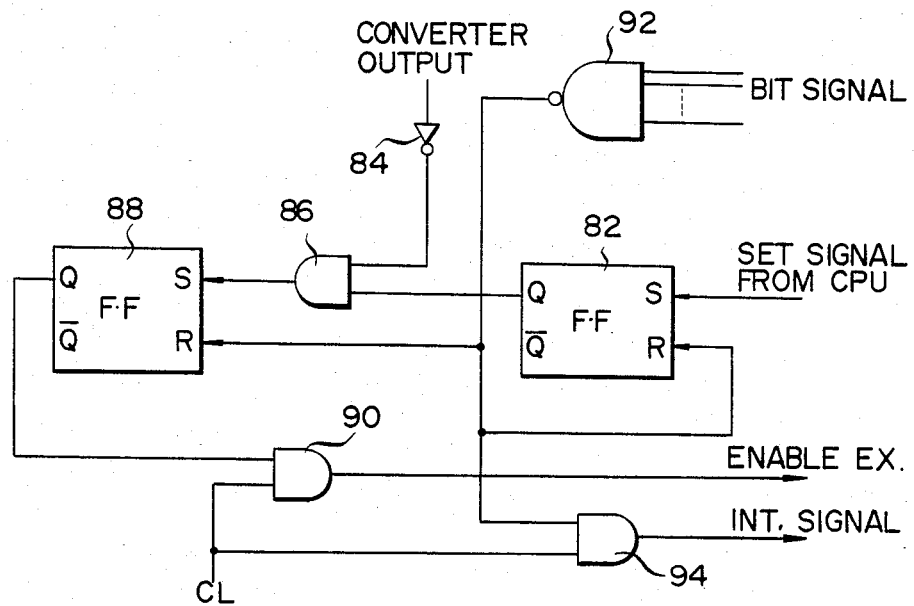
FIG. 5 sets forth the concrete arrangement of a control circuit in the A-D converter of FIG. 4.

There will now be described by reference to FIG. 5 the arrangement of the control circuit 50. This control circuit 50 comprises a first flip-flop circuit 82 whose set terminal S receives a preset signal from the data-processing unit 44; an inverter 84 which inverts the phase of an output pulse from the V-T converter 46; an AND gate 86 whose first input terminal receives an output pulse from the V-T converter 46, and whose second input terminal receives an output signal from the output terminal Q of the first flip-flop circuit 82; a second flip-flop circuit 88 whose set terminal S receives an output pulse from the AND gate 86, and whose output terminal Q generates an enable signal EX; an AND gate 90 whose first input terminal receives an output enable signal EX from the second flip-flop circuit 88, and whose second input terminal receives an output clock pulse from the clock pulse generator 58; a NAND gate 92 which receives a plurality of bit signals from the first counter 52 which represent a number preset in said counter 52, and generates a signal which acts as a reset signal for both first and second flip-flop circuits 82, 88 and also as an interruption instruction for the data-processing unit 44; and an AND gate 94 whose first input terminal receives an output signal from the NAND gate 92, and whose second input terminal receives an output clock pulse from the clock pulse generator 58.

Figure 7:
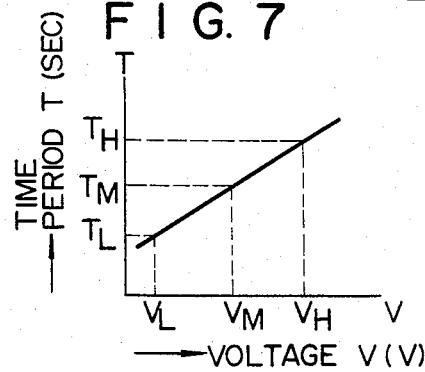
FIG. 7 shows the relationship between the voltage level of an analog input signal supplied to the V-T converter of FIG. 1 and the time period of an output oscillated signal.

The respective blocks of the A-D converter have been briefly outlined by reference to FIG. 4. There will now be described the operation of the entire A-D converter by reference to the timing chart of FIGS. 6A to 6G and the V-T characteristic curve of the V-T converter 46 shown in FIG. 7.

First, channel-selecting data (FIG. 6A) is sent forth from the data-processing unit 44 through the latch circuit 47 to the multiplexer 42. The multiplexer 42 selects the channel of a voltage signal corresponding to the contents of said channel-selecting data. The voltage signal of the selected channel is delivered to the V-T converter 46. An output pulse (FIG. 6B) from the V-T converter 46 is supplied to the first input terminal of the first AND gate 48 and also to the inverter 84 of the control circuit 50. A signal whose phase has been inverted by the inverter 84 is conducted to the first input terminal of the AND gate 86. A value N (FIG. 6C) being preset in the first counter 52 is supplied from the data-processing unit 44 through the bus 54. At this time, the data-processing unit 44 delivers a set signal through the port 130 to the set terminal S of the first flip-flop circuit 82 of the control circuit 50, causing a signal having a logic level of "1" to be produced from the output terminal Q of the first flip-flop circuit 82. Said "1" level signal is carried to the second input terminal of the AND gate 86. As previously described, an output pulse from the V-T converter 46 is already supplied to the first input terminal of the AND gate 86 through the inverter 84. When, therefore, a fall arises in the first pulse delivered from the V-T converter 46 after the supply of a preset signal to the first counter 52, then the AND gate 86 issues a signal having a logic level of "1". This "1" level signal is conducted to the set terminal S of the second flip-flop circuit 88, whose output terminal Q generates a signal having a logic level of "1". This "1" level signal acts as an enable signal EX (FIG. 6D) for the first and second counters 52, 60. The enable signal EX is delivered to the first input terminal of the AND gate 90 whose second input terminal receives a clock pulse (FIG. 6E) from the clock pulse generator 58. The enable signal EX is supplied to the first and second counters 52, 60 in synchronization with the clock pulse CL. Upon receipt of the enable signal EX, the first AND gate 48 is opened to cause an output pulse from the V-T converter 46 to be sent forth to the first counter 52. When supplied with the enable signal EX, the second AND gate 56 is opened to allow a clock pulse CL issued from the clock pulse generator 58 to be carried to the second counter 60. A count made by the first counter 52 is decreased by 1 bit, each time an output pulse from the V-T converter 46 is received (FIG. 6C). A count made by the second counter 60 is increased by 1 bit, each time a clock pulse CL is received (FIG. 6F). The respective bit signal lines extend from the first counter 52 to the NAND gate 92 of the control circuit 50. While a value N is preset in the first counter 52, signals of bit lines thereof have a logic level of "1". When the contents of the first counter 52 are reduced to zero by subtraction, the signals of all the bit lines of said counter 52 have the logic level changed to "0", causing the NAND gate 92 to produce an output signal having a logic level of "1". This "1" level signal is supplied to the reset terminal R of the first and second flip-flop circuits 82, 88, thereby preventing the issue of an enable signal EX from the second flip-flop circuit 88, and stopping the operation of the second counter 60. When synchronized with a clock pulse CL delivered from the AND gate 94, a "1" level output signal from the NAND gate 92 acts as an interruption instruction (FIG. 6G). Upon receipt of this interruption instruction, the data-processing unit 44 sends forth a fresh channel-selecting data to the multiplexer 42 through the latch circuit 47 to change over the channel of said multiplexer 42. A count made by the second counter 60 up to this point is stored in the register of the data-processing unit 44.

When the channel of the multiplexer 42 has thus been shifted, the above-mentioned operation cycle is commenced again, starting with the presetting of a value N in the first counter 52. Where such operation cycle is carried out with respect to a voltage signal having a high prescribed voltage level $V_H$, a voltage signal having a low referential voltage level and analog input voltage signals being measured which have different voltage levels $V_{Ml}$ to $V_{Mi}$, then the second counter 60 makes the corresponding counts $n_H$, $n_L$ and $n_M$. Now assuming that the clock pulse has a frequency of 1.28 MHz, then the time period T of an output signal from the V-T converter 46 may be expressed by the following general formula:

$$T = \frac{n}{N} \times \frac{1}{1.28} \text{ (microseconds)} \qquad (2)$$

$$= \frac{n}{N} \times 0.78125$$

As apparent from the later given fractional equation, the term of N and the term of 0.78125 can be deleted. Therefore, it is practically unnecessary to carry out the division of 0.78125/N.

The V-T characteristic of the V-T converter 46 (relationship between the voltage level of an input signal and the time period of an oscillated output signal) can be represented by a linear curve shown in FIG. 2. Now let it be assumed that $T_H$ denotes the time period of an output signal from the V-T converter 46 when a signal having a high prescribed voltage level $V_H$ is supplied; $T_L$ said time period when a signal having a low reference voltage level $V_L$ is introduced; and $T_M$ said time period when analog input signals having different voltage level $V_{Ml}$ to $V_{Mi}$ are received. Then relationship between the voltage levels $V_H$, $V_L$, $V_{Ml}$ to $V_{Mi}$ of the input signals and the corresponding time periods of output signals from the V-T converter 46 takes a pattern illustrated in FIG. 7. Therefore, A-D converted data M on the different voltage levels $V_{Ml}$ to $V_{Mi}$ of input signals may be determined from the following equation (3):

$$M = V_L + (V_H - V_L) \times \frac{T_M - T_L}{T_H - T_L} \quad (3)$$

With the low referential voltage level $V_L$ taken to be zero, there results:

$$(V_H - V_L) = V_H$$

Now assuming that the high prescribed voltage level $V_H$ is a maximum value taken by an analog input voltage signal being measured which is supplied to the V-T converter 46, and said maximum voltage level is expressed, for example, as $2^n$ (n represents a bit number), then the A-D converted data M may be determined from the following fractional equation:

$$M = \frac{T_M - T_L}{T_H - T_L} \times 2^n \quad (4)$$

$$= \frac{\frac{n_M}{N} \times 0.78125 - \frac{n_L}{N} \times 0.78125}{\frac{n_H}{N} \times 0.78125 - \frac{n_L}{N} \times 0.78125} \times 2^n$$

$$= \frac{n_M - n_L}{n_H - n_L} \times 2^n$$

Calculation of the above equation (4) is carried out by the data-processing unit 44.

The counts $n_H$, $n_L$, $n_M$ of the second counter 60 corresponding the voltage levels of input signals $V_H$, $V_L$, $V_{Ml}$ to $V_{Mi}$ are stored in the internal registers of the data-processing unit 44. Therefore, the counts $n_H$, $n_L$, $n_M$ can be easily read out in carrying out the calculation of the above equation (4).

Figure 8:
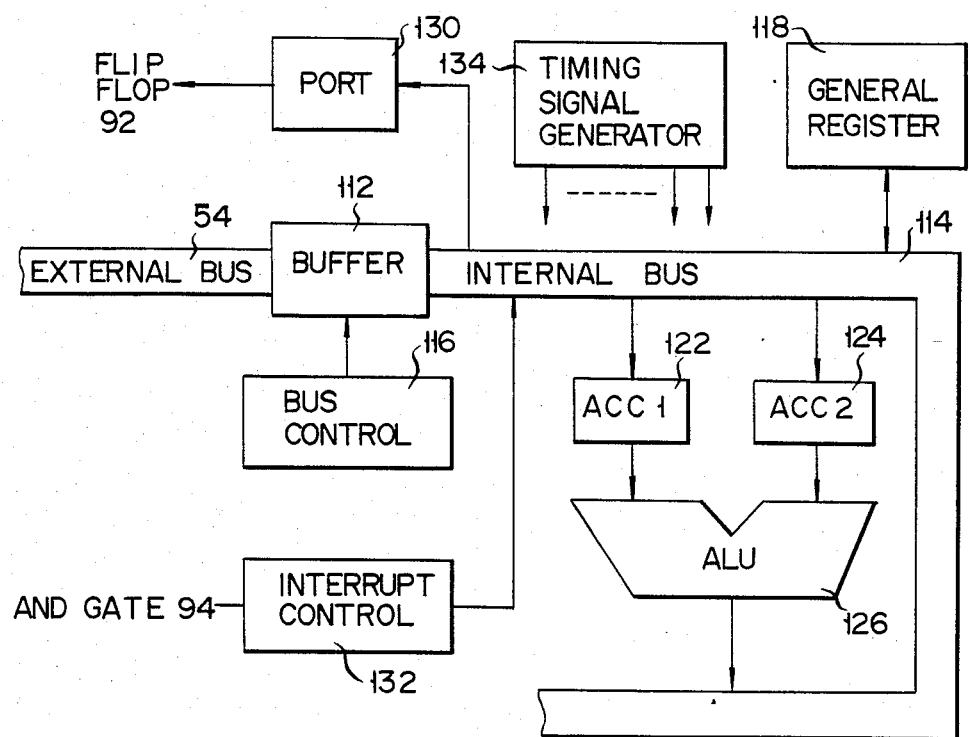
FIG. 8 sets forth a block circuit diagram of a central processing unit in the A-D converter of FIG. 4.

The data-processing unit or CPU 44 has such a structure as shown in FIG. 8. As FIG. 8 shows, a buffer 112 connects the external bus 54 to an internal bus 114. To the buffer 112 a bus controller 116 is connected for controlling the data transfer between the external bus 54 and the internal bus 114. General registers GR0 to GR7 (not shown), or internal registers 118, are connected to the internal bus 114. The general register GR0 is used as a program counter, and the general register GR1 is used as a program status word counter. The general register GR2 temporarily stores a preset value N which is read out from the external ROM 41 and which is to be supplied to the first counter 52. The general registers GR3, GR4 and GR5 temporarily store count contents $n_H$, $n_L$ and $n_M$ supplied from the second counter 60, respectively. In response to a control signal (a read instruction) from a microprogram read only memory (ROM) 120 the general register GR2 supplies the preset value N to the first counter 52 through the internal bus 114 and the external bus 54.

To the internal bus 114 an accumulator (ACC1) 122 and an accumulator (ACC2) 124 are connected. Count contents $n_H$, $n_L$ and $n_M$ are read out from the general registers GR3, GR4 and GR5 and supplied through the internal bus 114 to the ACC1 122 and the ACC2 124. The ACC1 122 and the ACC2 124 temporarily store count contents $n_H$, $n_L$ and $n_M$. Using count contents $n_H$, $n_L$ and $n_M$ stored in the ACC1 122 and the ACC2 124, an arithmetic logic unit (ALU) 126 performs arithmetic operation which is given by equation (4). The result of the operation is stored into any of the general registers GR3 to GR5 through the internal bus 114.

To the internal bus 114 an instruction register 128 is connected. The instruction register 128 temporarily stores instructions read from the external ROM 41. To the instruction register 128 the microprogram ROM 120 is connected which functions as an instruction decoder. The microprogram ROM 120 decodes the instruction read from the instruction register 128. The output data from the microprogram ROM 120 is supplied to the CPU 44 and controls a port 130, an interrupt control 132, a bus control 116, the ACC1 122, the ACC2 124, the ALU 126, and the general registers 118. The microprogram ROM 120 is connected to these components of the CPU 44 by signal lines (not shown).

The port 130 is connected to the internal bus 114 and supplies a set signal to the set terminal S of the first flip-flop 82 of the control circuit 50, under the control of a control signal from the microprogram ROM 120. The CPU 44 further comprises a timing signal generator 134 which functions as a timing controller and generates clock pulses at predetermined intervals. A clock pulse from the timing signal generator 134 is supplied to the port 130, the interrupt control 132, the bus control 116, the ACC1 122, the ACC2 124, the ALU 126 and the general registers 118. The timing signal generator 134 is connected to these components by signal lines (not shown). In FIG. 8 address signals used are not shown, thus making the figure simple.

To perform A-D conversion the CPU 44 operates in the following way.

An A-D conversion instruction program is composed of a main instruction program and an interrupt instruction program. The main instruction program is read from the external ROM 41 and stored into the instruction register 128. It is then read out of the instruction register 128 and decoded by the microprogram ROM 120. The first instruction contained in the main instruction program designates a channel the multiplexer 42 will select, e.g. a high voltage $V_H$ channel. By executing this instruction, a channel selecting data is supplied to the latch circuit 47. The multiplexer 42 selects the channel designated by the data latched by the latch circuit 47. The second instruction contained in the main instruction program instructs the presetting of preset value N to the counter 52. According to the second instruction, preset value N is preset to the counter 52. The third instruction contained in the main instruction program designates the setting of the first flip-flop 82 of the control unit 50. According to the third instruction, the port 130 delivers a set signal to the set terminal S of the first flip-flop 82 of the counter unit 50. Hence, the second counter 60 counts the clock pulses from the clock pulse generator 58 while the first counter 52 is counting N output pulses from the V-T counter 46. When the first counter 52 finishes counting N output pulses, the AND gate 94 of the control circuit 50 produces an interrupt signal. The interrupt signal is supplied to the interrupt control 132 of the CPU 44. Upon receipt of the interrupt signal the interrupt control 132 stops the execution of the main instruction program and begins the execution of the interrupt instruction program. As a result of the interrupt service program execution, the count of the second counter 60, e.g. count content $n_H$, is stored into the general register GR3 through the buses 54 and 114.

The sequence of steps described above is repeated, whereby other channels are designated one after another, the second counter 60 counts clock pulses while the first counter 52 is counting N output pulses from the V-T converter 46, thus delivering count contents $n_L$ and $n_M$, and these count contents $n_L$ and $n_M$ are stored into the general registers GR4 and GR5, respectively.

When all the counter contents $n_H$, $n_L$ and $n_M$ are stored into the general registers GR3, GR4 and GR5, respectively, they are supplied, one by one, selectively to the ACC1 122 and the ACC2 124 and temporarily stored in the ACC1 122 and the ACC2 124. Using the count contents $n_H$, $n_L$ and $n_M$ stored selectively in the ACC1 122 and the ACC2 124, the ALU 126 performs the arithmetic operation of equation (4) in accordance with the main instruction program read from the external ROM 41. More precisely, the arithmetic operation is carried out in the following manner.

First, count contents $n_M$ and $n_L$ are read from the general registers GR5 and GR4, respectively, and are then stored into the ACC1 122 and the ACC2 124, respectively, through the internal bus 114. The ALU 126 then performs subtraction (ACC1−ACC2), i.e. $(n_M - n_L)$. The difference obtained is stored into, for example, the general register GR5 through the internal bus 114. Thereafter, count contents $n_H$ and $n_L$ are read from the general registers GR3 and GR4, respectively, and are then stored into the ACC1 122 and the ACC2 124, respectively, via the internal bus 114. The ALU 126 performs subtraction $(n_H - n_L)$. The difference obtained is stored into, for example, the general register GR3. This done, the difference $(n_M - n_L)$ is read from the general register GR5 and stored into the ACC1 122 and the ALU 126 performs multiplication of $(n_M - n_L) \times 2^n$. The product thus obtained is stored into the general register GR5. The product is read from the general register GR5 and stored into the ACC1 122, and the difference $(n_H - n_L)$ is read from the general register GR3 and stored into the ACC2 124. The ALU 126 divides $(n_M - n_L) \times 2^n$ by $(n_H - n_L)$. The quotient thus obtained is an A-D converted data.

The A-D converter of this invention arranged as described above have the advantages that part of the function of hardware is taken over by the data-processing unit or CPU 44 of a computer system, thereby decreasing the amount of hardware by that extent and in consequence reducing the cost of hardware; a value N being preset in the first counter 52 can be freely chosen by a program in conformity to the demanded precision of A-D conversion or the required frequency stability of a clock pulse; the voltage levels of input signals can be measured in any optional order; the counts $n_H$, $n_L$ of the second counter 60 corresponding to the high prescribed voltage levels $V_H$ and low referential voltage level $V_L$ can be used in common in determining the A-D converted data on the different voltage levels $V_{M1}$ to $V_{Mi}$ of the analog input signals being measured; since errors in the A-D conversion do not arise from the low precision of the frequency of an output signal from the V-T converter 46 but from the low precision of the frequency of a clock pulse CL, the stabilization of the frequency of the clock pulse CL can elevate the precision of the A-D conversion; and consequently it is relatively easy to manufacture an A-D converter with high precision. Where clock pulses CL are counted for long by the second counter 60 with the first counter 52 preset at a larger N value, then the effect of noises on the A-D converted data is homogenized, thereby decreasing errors in said data.

This invention is not limited to the foregoing embodiment. Where the data-processing unit 44 is provided with a clock pulse counter, then said counter may replace the second counter 60. Further, the control circuit 50, first AND gate 48, second AND gate 56, etc. may be incorporated in the data-processing unit 44.

FIG. 9 represents an embodiment using a V-T converter causing an output pulse to be issued at a relatively long interval. Application of such V-T converter only requires a single counter.

FIGS. 10A to 10E jointly constitute a timing chart for the respective sections of the A-D converter of FIG. 9. FIG. 10A shows the waveform of an output signal from the V-T converter. FIG. 10B indicates the waveform of an output enable signal EX from the control circuit. FIG. 10C denotes clock pulses CL. FIG. 10D indicates the contents of a counter. FIG. 10E illustrates the waveform of an interruption instruction delivered from the control circuit.

There will now be described the operation of the A-D converter of FIG. 9 by reference to the timing charts of FIGS. 10A to 10E. The parts of FIG. 9 the same as those of the A-D converter of FIG. 4 are denoted by the same numerals, description thereof being emitted.

According to the embodiment of FIG. 9, an output signal (FIG. 10A) from a V-T converter 100 is supplied to a control circuit 50. The logic level of an output enable signal EX (FIG. 10B) from the control circuit 50 changes to "1" in synchronization with the fall of an initial output pulse from the V-T converter 100, and to "0" in synchronization with the fall of a second output pulse from said control circuit 50. A clock pulse (FIG. 10C) is supplied to the first input terminal of the AND gate 56. An enable signal EX is conducted to the second input terminal of the AND gate 56. While the second input terminal of the AND gate 56 is supplied with an enable signal having a logic level of "1", a clock pulse passes the AND gate 56. A counter 60 counts a number of clock pulses conducted through the AND gate 56 (FIG. 10D). Where the enable signal EX is extinguished, namely, has a logic level of "0", then the counter 60 ceases counting. At this time, the control unit 50 sends forth an interruption instruction (FIG. 10E) to the data-processing unit 44, causing the contents of the counter 60 to be stored in the register of the data-processing unit 44. The channel of the multiplexer 42 is shifted, and the previously-described processing cycle is carried out with respect to a fresh input voltage signal. Thus the counter 60 makes a count corresponding to the voltage levels $V_H$, $V_L$, $V_M$ of the respective input signals. A-D converted data on these voltage levels $V_H$, $V_L$, $V_M$ is calculated by the data-processing unit 44. With the embodiment of FIG. 9, the time period of pulses issued from the V-T converter 100 is counted by clock pulses, making it unnecessary to provide a counter 52. Since pulses are generated at a long interval, errors in the A-D converted data on the respective voltage levels are reduced, because a large number of clock pulses can be counted during said interval.

The foregoing embodiments relate to the A-D converter provided with the V-T converter. The time period T and frequency f of an input signal have a relationship of $T = 1/f$, namely the time period T is a reciprocal of the frequency f. Therefore, the V-T converter described herein should be construed to include a voltage-frequency converter (V-F converter).

What we claim is:

1. An A-D converter for converting into a pulse train signal an analog input voltage signal from a signal source which is to be measured, said A-D converter comprising:

first signal means for providing a first analog input voltage signal of a first fixed level $V_L$;

second signal means for providing a second analog input voltage signal of a second fixed level $V_H$ which is higher than said first fixed level $V_L$;

multiplexer means connected to said signal source, said first signal means and said second signal means for receiving the signals therefrom and supplying the signals selectively and successively;

a V-T converter connected to said multiplexer means for converting a selected one of the analog input voltage signal to be measured and the first and second analog input voltage signals into a pulse train signal having a period linearly proportional to the voltage level of the selected analog input voltage signal;

a memory for storing instruction programs used for A-D conversion;

a central processing unit;

a first counter connected to said V-T converter to count the number of pulses of said pulse train signal issued from said V-T converter, said first counter also being connected to an external bus and loaded with a specific value through the external bus from the central processing unit;

a clock pulse generator producing clock pulses of fixed period;

a second counter connected to said clock pulse generator to continue counting the number of said clock pulses issued from said clock pulse generator during the time interval when said first counter continues counting, said second counter being also connected to the external bus, through which the contents of said second counter is to be read by the central processing unit;

control means operable to issue an enabling signal for controlling the start and stop of counting of said first and second counters such that when counting is stopped, the contents of said second counter represents a time interval during which said first counter counts out said specific number of pulses issued from said V-T converter, said control means operable to supply an interrupt signal to the central processing unit when said first counter counts out the number of pulses equal to said specific value loaded through the external bus from the central processing unit; and said central processing unit comprising an internal bus, register means including a program counter and connected to said internal bus, at least one accumulator connected to said internal bus for storing data, an arithmetic logic unit connected to said internal bus and said at least one accumulator and for performing an arithmetic calculation on the basis of the data stored in said register means and said at least one accumulator, an interrupt control connected to said control means for receiving an interrupt signal therefrom to control the start of an interrupt program, a buffer for connecting said external bus to said internal bus, and a bus control connected to said buffer for generating control signals required to perform data transfer, by way of said external and internal buses, between said multiplexer means and first and second counters, and between those circuits in said central processing unit which are connected to said internal bus, said arithmetic calculation being indicated by the following equation:

$$M = (n_M - n_L)/(n_H - n_L) \times 2^n$$

where,

M is the digital value of the unknown voltage level $V_M$ of the analog input voltage signal to be measured, $2^n$ is a full scale of the converted digital value, $n_L$ is the contents of said second counter which represents the time interval during which said first counter counts out said first specific number of pulses under the condition that said first analog input signal of said first voltage level $V_L$ is selected as the input signal to said V-T converter, $n_H$ is the contents of said second counter which represents the time interval during which said first counter counts out said specific number of pulses under the condition that said second analog input signal of said second voltage level $V_H$ is selected as the input signal to said V-T converter, and $n_M$ is the contents of said second counter which represents the time interval during which said first counter counts out said specific number of pulses under the condition that said analog input signal of said unknown voltage level $V_M$ is selected as the input signal to said V-T converter.

2. An A-D converter according to claim 1 further comprising:

a first logic gate which, upon receipt of an enabling signal from the control means, supplies an output pulse from the V-T converter to the first counter, and a second logic gate, which, upon receipt of an enabling signal from the control means, conducts a clock pulse issued from the clock pulse generator to the second counter and wherein said control means comprises a first flip-flop circuit which is set upon receipt of a set signal from the central processing unit, an inverter for inverting the phase of an output pulse from the V-T converter, a third logic gate for allowing the passage of an output signal from the inverter while supplied with an output signal from the first flip-flop circuit, a second flip-flop circuit which is set upon receipt of an output signal from the first flip-flop circuit, a fourth logic gate for allowing the passage of an output signal from the second flip-flop circuit to the first and second logic gates in synchronization with an output clock pulse from the clock pulse generator, a NAND gate for obtaining a NAND product of a plurality of bit signals delivered from the first counter and sending forth an output signal to reset the first and second flip-flop circuits, and a fifth logic gate for allowing the passage of an output signal from the second flip-flop circuit to the central processing unit in synchronization with a clock pulse issued from the clock pulse generator.

3. An A-D conversion method using a V-T converter wherein the voltage level of an input signal and the time period of an oscillated output signal have a linear relationship, and comprising the steps of:
- (A) loading a first counter with a specific value,
- (B) supplying a first analog input voltage signal of a first voltage level $V_L$ to said V-T converter,
- (C) counting, by said first counter, first pulses issued from said V-T converter which correspond to the voltage level $V_L$ of the first analog input voltage signal until the number of pulses counted by said first counter has come to said specific value,
- (D) counting, by a second counter, clock pulses issued from a clock pulse generator while said first counter counts first pulses from said V-T converter,
- (E) loading the number $n_L$ of clock pulses counted by said second counter into a central processing unit,
- (F) loading said first counter with said specific value;
- (G) supplying a second analog input voltage signal of a second voltage signal $V_H$ to said V-T converter,
- (H) counting, by said first counter, second pulses issued from said V-T converter which correspond to the voltage level $V_H$ of the second analog input voltage signal until the number of pulses counted by said first counter has come to said specific value,
- (I) counting, by said second counter, clock pulses issued from the clock pulse generator while said first counter counts second pulses from said V-T converter,
- (J) loading the number $n_H$ of clock pulses counted by said second counter into said central processing unit,
- (K) loading said first counter with said specific value,
- (L) supplying an analog input voltage signal of an unknown voltage level $V_M$ to be measured to said V-T converter,
- (M) counting, by said first counter, third pulses issued from said V-T converter which correspond to the unknown voltage level $V_M$ of the analog signal to be measured until the number of pulses counted by said first counter has come to said specific value,
- (N) counting, by said second counter, clock pulses issued from the clock pulse generator while said first counter counts third pulses from said V-T converter,
- (O) loading the number $n_M$ of clock pulses counted by said second counter into said central processing unit, and
- (P) carrying out the equation $$M = (n_M - n_L)/(n_H - n_L) \times 2^n$$

by the central processing unit to calculate the digital value M converted from the unknown voltage level $V_M$ on the basis of the pulse information stored in the central processing unit where, $2^n$ is a full scale of the converted digital value.

4. An A-D conversion method according to claim 3 wherein the steps of (A), (B), (C), (D), (E), (F), (G), (H), (I), (J), (K), (L), (M), (N), (O) and (P) are carried out in this order.

5. An A-D conversion method according to claim 3 wherein the steps of (A), (B), (C), (D), (E), (K), (L), (M), (N), (O), (F), (G), (H), (I), (J) and (P) are carried out in this order.

6. An A-D conversion method according to claim 3 wherein the steps of (F), (G), (H), (I), (J), (A), (B), (C), (D), (E), (K), (L), (M), (N), (O) and (P) are carried out in this order.

7. An A-D conversion method according to claim 3 wherein the steps of (K), (L), (M), (N), (O), (F), (G), (H), (I), (J), (A), (B), (C), (D), (E) and (P) are carried out in this order.

8. An A-D conversion method according to claim 3 wherein the steps of (K), (L), (M), (N), (O), (A), (B), (C), (D), (E), (F), (G), (H), (I), (J) and (P) are carried out in this order.

9. An A-D conversion method according to claim 3 wherein the steps of (K), (F), (G), (H), (I), (J), (K), (L), (M), (N), (O), (A), (B), (C), (D), (E) and (P) are carried out in this order.

* * * * *